United States Patent [19]
Li

[11] Patent Number: 6,137,634
[45] Date of Patent: Oct. 24, 2000

[54] MICROLENS ARRAY

[75] Inventor: Zong-Fu Li, Gilbert, Ariz.

[73] Assignee: Intel Corporation, Santa Clara, Calif.

[21] Appl. No.: 09/241,622

[22] Filed: Feb. 1, 1999

[51] Int. Cl.$^7$ .................................................. G02B 27/10
[52] U.S. Cl. .......................................................... 359/619
[58] Field of Search .................................... 359/619, 620; 430/273.1; 427/58

[56] References Cited

U.S. PATENT DOCUMENTS

| | | | |
|---|---|---|---|
| 5,939,236 | 8/1999 | Pavelchek et al. ................... | 430/273.1 |
| 5,986,036 | 11/1999 | Gierow et al. ........................... | 528/170 |
| 6,055,006 | 4/2000 | Murano .................................. | 347/118 |

OTHER PUBLICATIONS

E.K. Pavelchek, et al., "Acrylic Topcoat Optimization via Dynamic Mechanical Analysis, " Society for Information Display, Int'l. Symposium, Digest of Technical Papers, pp. 775–778 (1995).

D. Perettie, "Perfluorocyclobutane Containing Aromatic Ether Polymers as an Electronic Grade Resin for Flat Panel Displays, " SPIE vol. 1911, pp. 15–20 (1993).

A.K. St. Clair, et al., "Evaluation of Colorless Polyimide Film for Thermal Control Coating Applications, " NASA Langley Research Center, Jan., 1985, pp. 1–18.

"LaRC–CPI and LaRC–CP2, "made by SRS Technologies Film Data Sheet and web page (1999) (3 pages).

Primary Examiner—Ricky Mack
Attorney, Agent, or Firm—Blakely, Sokoloff, Taylor & Zafman LLP

[57] ABSTRACT

A method of forming a microlens including, in one aspect, depositing a substantially non-photo-imageable microlens material over an area of a chip, a portion of which contains an array of photosensitive circuits, and patterning the microlens material over the array of photosensitive circuits to define a microlens over each photosensitive circuit.

18 Claims, 5 Drawing Sheets

MICROLENS ARRAY

BACKGROUND

The invention relates to optical devices and more particularly to a microlens structure or array over a photosensitive array.

Description of Related Art

Digital imaging systems, such as, for example, digital cameras, utilize integrated circuit devices or chips as image capturing devices. An imaging system, such as a camera, uses light to capture an image on a semiconductor-based chip. The chip replaces film in traditional film-based systems. In a digital camera, an image sensor is configured, in its simplest form, to capture a monochrome or color image by way of field effect transistors (FETs), such as complementary metal oxide semiconductor (CMOS) devices or charge coupled devices (CCDs).

In one example, the image sensor comprises a semiconductor chip made up of a number of photosensitive circuits, each photosensitive circuit capable of absorbing light. In color applications, each photosensitive circuit generally absorbs light through a color filter that represents a particular wavelength of light in the visible spectrum corresponding to the image sensed.

The photosensitive circuits of an image sensor, often referred to as pixel circuits, are generally arranged in an array, such as for example 480 rows by 640 columns. In general, each photosensitive circuit contains a photosensing element, such as a photodiode or charge-coupled device (CCD), and other circuitry. The photosensing element defines a photosensing region or area of the photosensitive circuit that responds to light while the circuitry, generally speaking, drives a light signal from the photosensing region or area to other process circuitry.

One method of converting a monochromatic digital imaging system into a color imaging system involves absorbing light through a color filter. The color performance of any color filter concerns the ability of the filter to select color corresponding to the desired wavelength of the visible spectrum of the color filter array (CFA) material. A common color filter material is spin coated-, dyed-, or pigmented-photoresist CFA material.

In order to improve the light collecting efficiency of a photosensing circuit, a microlens is typically formed on top of the CFA material overlying each photosensitive circuit. A planarization layer having high transparency properties may also be deposited between the color filter array and the microlens material.

The microlens material is typically a photoresist. Initially, even the generally transparent photoresist is initially yellow or otherwise not entirely transparent after formation. The lack of transparency is generally attributed to the photosensitivity component (such as a photoacid compound) of the photoresist material. In order to increase the transparency, the photoresist is often bleached. Photobleaching occurs after the deposition and patterning of the microlens material, for example, as a photobleaching with ultraviolet light to cross-link the photoresist molecules and destroy the photosensitivity of the microlens. In general, the greater the cross-linking and the destruction of the photosensitivity of the microlens, the greater the transparency clarity of the microlens. An incomplete photobleaching will result in a microlens that is not completely transparent or that is yellow.

Another problem with using photoresist material as the microlens material is that temperatures greater than 150° C. tend to degrade the photoresist material and cause the deformation of the microlens shape. Many steps in forming an image sensor, however, sometimes include heating to greater than 200° C., such as surface mount processes to couple the sensor package to a printed circuit board (PCB). Such temperatures therefore may damage or destroy the microlenses and the benefits desired with the incorporation of the microlenses. Thus, the instability at high temperatures of photoresist-based microlens material has generally restricted image sensor packaging on printed circuit boards to manual processes such as local heating solder processes in which package leads are connected through soldering while the sensor with CFA material and microlens material is kept at a lower temperature.

What is needed is an improved microlens.

SUMMARY

A method of forming a microlens is disclosed. In one aspect, the method includes depositing a substantially non-photo-imageable microlens material over an area of an integrated circuit chip, a portion of which contains an array of photosensitive circuits, and patterning the microlens material over the array of photosensitive circuits to define a microlens over each photosensitive circuit. A photosensitive array and an imaging system are also disclosed.

BRIEF DESCRIPTION OF THE DRAWINGS

FIG. 3b shows a schematic perspective top view of the sensor of FIG. 3a.

DETAILED DESCRIPTION

The invention relates to an optical device, such as an image sensor to be used, for example, in a camera application. One aspect of the invention involves the method of forming a microlens of a non-photo-imageable material on an image sensor of an integrated circuit chip, such as a CMOS- or CCD-based image sensor. The advantage of using a non-photo-imageable material is the concerns of incomplete cross-linking and yellowing of photosensitive resist may be reduced. Further, the concern of a photo-imageable material, such as a photoresist, degrading under the high temperature condition typically used in sensor fabrication is reduced. Embodiments of the invention relate to an image sensor, a method of forming a microlens, and an imaging system, such as a camera, that incorporate an image sensor having microlenses such as described above.

Figure 1:
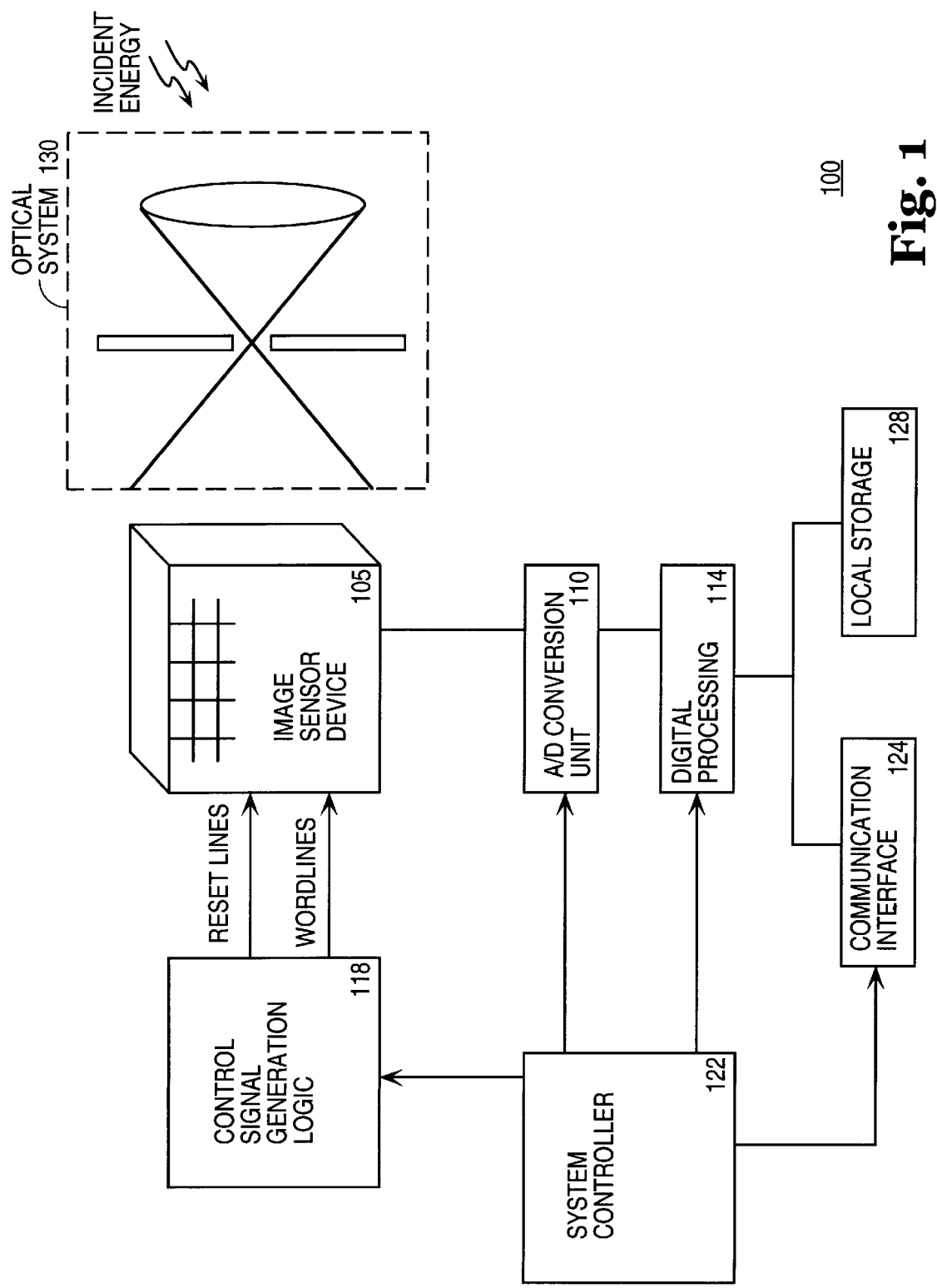
FIG. 1 is a diagram showing an imaging system incorporating an image sensor of an embodiment of the invention.

FIG. 1 illustrates an embodiment of an imaging system. Imaging system 100 includes optical system 130 that channels the incident energy, e.g., light, to create an optical image on image sensor unit or image sensing unit 105. Control signal generation logic 118 is provided to generate reset signals in word lines employed to control photosensitive circuits of image sensor unit 105. Output values (e.g., sensor signals) may be processed in analog form before being fed to an analog-to-digital (A/D) conversion unit 110 that in turn feeds digital processing block 114. A/D unit 110, and portions of the digital processing block 114 may be located on the same die or chip as the photosensitive circuits although the invention is not limited in this respect. Digital processing block 114 may include hard-wired logic and/or a programmed processor that performs a variety of digital functions, including preparing digital image data based on the sensor signals for storage or transmission.

Transmission of the image data to an external processing system may be accomplished using communication interface 124. For instance, as a digital camera, system 100 will contain a communication interface that implements a computer peripheral bus standard such as, for example, universal serial bus (USB) or IEEE 1394-1995 although the invention is not limited in this respect. Imaging system 100 may also contain local storage 128 of the non-volatile variety including, for instance, a solid state memory such as a removable memory card, a rotating magnetic device, or other suitable memory device for permanent storage of digital image data. The operation of system 100 may be orchestrated by system controller 122 that may include a conventional microcontroller responding to instructions stored as firmware.

Figure 2:
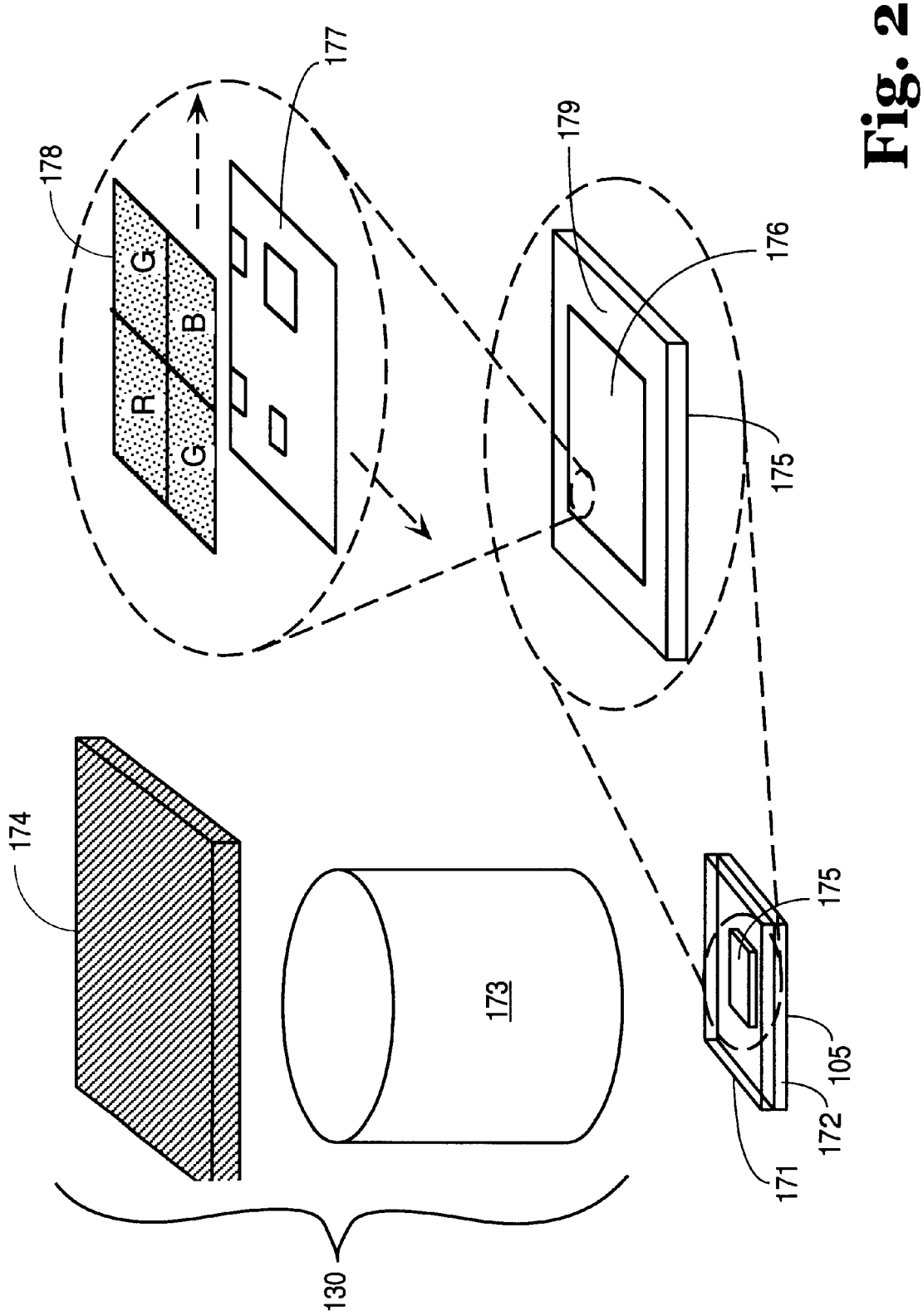
FIG. 2 shows a diagrammatical view of a portion of the imaging system of FIG. 1.

FIG. 2 shows a diagrammatical view of an embodiment of a portion of a digital imaging system including optical system 130 and image sensor unit 105. Image sensor unit 105 includes image sensor 175 in package 172. Conventional materials for package 172 include, but are not limited to, ceramic and plastic. In one embodiment, the top surface of package 172 includes a transparent cover substrate 171, such as glass or plastic, that overlies image sensor 175.

Overlying image sensor unit 105 and referenced as optical system 130 is lens assembly 173 and infrared blocking filter 174. Infrared blocking filter 174 overlies lens assembly 173 and serves to inhibit infrared light from striking image sensor unit 105.

In the insert of FIG. 2 is a magnified view of image sensor 175. A magnified view of image sensor 175 in turn shows some additional sensor components. Included within the components shown in FIG. 2 is the uppermost metal layer 177 having illustrative openings intended to modulate photosensitive circuit or pixel circuit responsivity. Overlying metal layer 177 is an array or mosaic of color filter array (CFA) material 178 covering, in this instance, four different photosensitive circuits or pixel circuits of image sensor 175:

One Red, two Green, and one Blue. The array or mosaic represents an illustrative tiling pattern for CFA material 178.

Figure 3A:
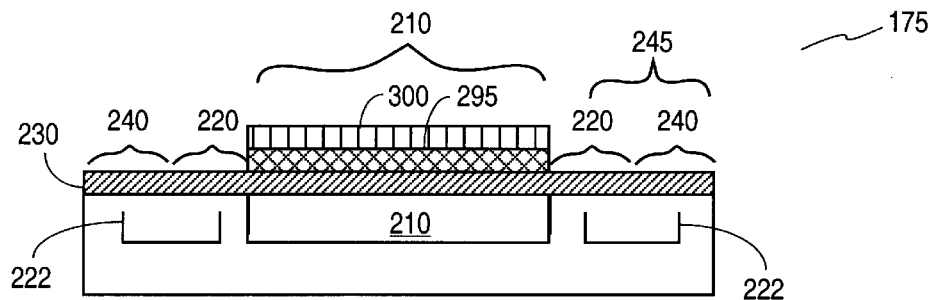
FIG. 3a shows a schematic, cross-sectional side view of an image sensor that may be used in an embodiment of the invention.
Figure 3B:
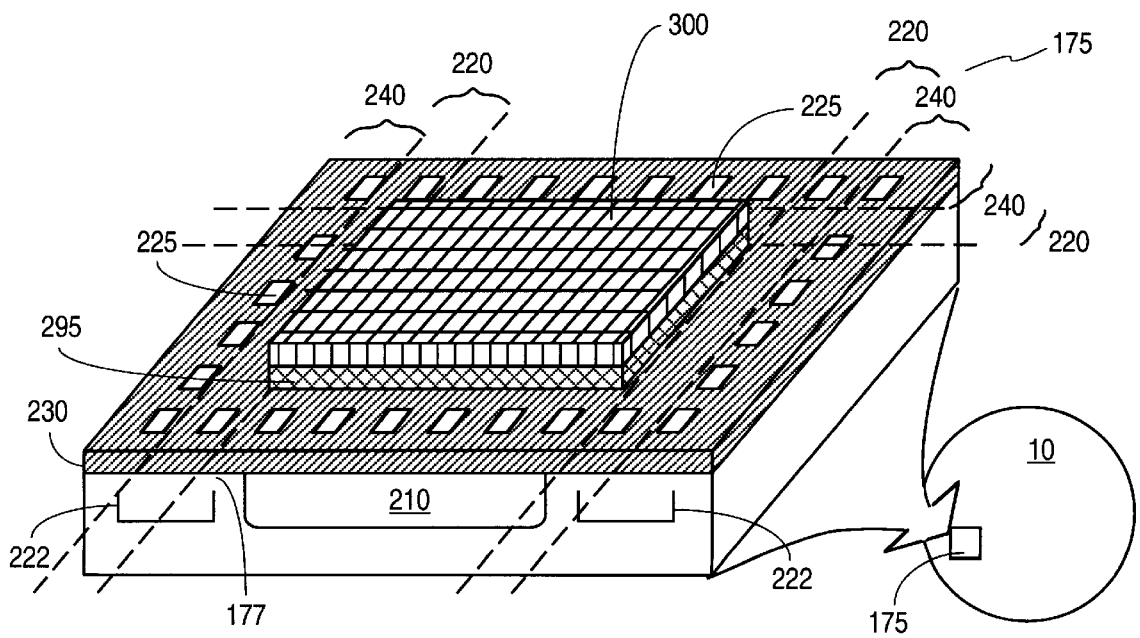

In one example, image sensor 175 comprises a chip made up of a number of photosensitive circuits, each photosensitive circuit capable of absorbing light. FIG. 3a illustrates a schematic, cross-sectional side view of a portion of image sensor 175. FIG. 3b illustrates a top perspective view of image sensor 175. Image sensor 175 is fabricated, in this embodiment, as part of a die or wafer 10 with a plurality of other devices. Once formed, individual image sensors are separated from one another typically by a sawing process. The individual image sensors are then placed in a package, such as package 172, of image sensor unit 105 as described above.

In FIGS. 3a and 3b, the photosensitive element occupies a region or area of image sensor 175 illustratively represented by photosensitive area 210. In addition to photosensitive area 210, image sensor 175 contains additional logic circuitry that operates the individual photosensitive circuits and drives signals from the pixels off image sensor 175. In FIGS. 3a and 3b, the logic circuitry occupies an area of image sensor 175 illustratively represented by logic area 220. It is to be appreciated that logic circuitry is not or need not be limited to logic area 220. Logic area 220 typically represents an area around the periphery of the sensor of logic circuitry as opposed to photosensitive structures, like, for example, photodiodes.

To provide power to image sensor 175 and to drive signals on and off image sensor 175, image sensor 175 contains bond pads 225. Bond pads 225 are generally arranged on the periphery of image sensor 175 and surround photosensitive area 210 and logic area 220. Bond pads 225 are typically located on the extreme periphery of image sensor 175 in contact or bond pad area 240. Bond pads 225 are electrically linked or coupled to device circuitry 222 that may include logic circuitry. Logic area 220 and contact or bond pad area 240 collectively define non-photosensitive area 245, separate from photosensitive area 210.

Overlying the top surface of image sensor 175 is transparent passivation layer 230. Passivation layer 230 is, for example, silicon nitride ($Si_3N_4$) or silicon oxynitride ($Si_xN_yO_z$). $Si_3N_4$ and $Si_xN_yO_z$ are chosen because of their transparent properties and their particular resistance to environmental contaminants, particularly moisture. Passivation layer 230 is deposited to a suitable thickness, such as, for example, approximately 8,000 angstroms (Å) according to state of the art technology. Passivation layer 230 overlies the entirety of image sensor 175, including photosensitive area 210 and non-photosensitive area 245 (logic area 220 and contact or bond pad area 240).

Overlying passivation layer 230, particularly in photosensitive area 210, is CFA material 295 such as dyed- or pigmented-photoresist. CFA material 295 is patterned into an array of color filter channels, one channel typically above one photosensitive circuit or pixel circuit. The color channels selectively allow light corresponding to a predetermined range of the visible spectrum to pass through a channel to image sensor 175. The group of color filter channels (e.g., Red, Green, Blue) make up a color system that either alone or by a mathematical manipulation, match or predict the human eye response.

Overlying CFA material 295, particularly in photosensitive area 210, is microlens material 300. Microlens material 300 serves, in one aspect, to increase the light collecting efficiency of each photosensitive circuit. The photosensitive element of each photosensitive circuit is typically surrounded by layers of conductive (e.g., interconnection lines) and non-conductive (e.g., insulating dielectric) layers creating a valley effect in which the photosensitive element, such as a photodiode, is at the base of the valley. A portion of light directed at an angle toward the photosensitive element can be obstructed from striking the photosensitive element by the surrounding layers. Microlens material 300 overlying the photosensitive circuit serves to redirect the otherwise obstructed light at the photosensitive element. Thus, the final shape of microlens material 300 generally determines the amount of light directed at the photosensitive circuit.

Figure 4:
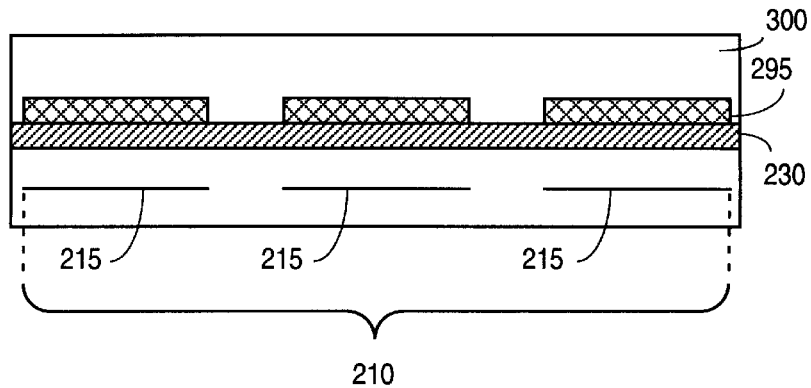
FIG. 4 shows a cross-sectional side view of a portion of an image sensor including three photosensitive circuits and a bond pad, a transparent passivation layer overlying the photosensitive circuits, CFA material overlying the passivation layer, and a planarized microlens material overlying the CFA material in accordance with an embodiment of the invention.

FIG. 4 illustrates a cross-sectional side view of a portion image sensor 175. FIG. 4 shows a portion of photosensitive area 210 including, in this example, three photosensitive circuits 215. Overlying photosensitive circuits 215 is passivation layer 230 of, for example, $Si_3N_4$ and $Si_xN_yO_z$. Overlying each photosensitive circuit 215 in photosensitive area 210 is CFA material 295. Finally, FIG. 4 shows microlens material 300 overlying photosensitive area 210.

In one embodiment of the invention, microlens material 300 is a highly transparent polymeric coating. Microlens material 300 includes materials that have a high transmissivity (>90%) across the visible spectrum of light (380–780 nm). The material should be stable in the presence of conventional processing conditions, including temperatures for image sensor fabrication and packaging. For example, microlens material 300 should be stable for temperatures in excess of 200° C. and should not degrade or yellow in the presence of temperature or other environmental factors including moisture uptake. Examples of suitable materials for non-photosensitive, thermally stable microlens material 300 include, but are not limited to, acrylic polymers with cross-linking components such as certain hydroxyl, epoxy, and amino compounds that may cross-link with one another, silicones, particularly organosilicons, and polysiloxanes. Suitable materials also include substantially colorless polyimide and perfluorocyclobutane containing ether polymers.

The transparent, thermally stable, non-photosensitive microlens material can typically be obtained from commercially available sources. An example of transparent acrylic overcoat microlens material is XP-9480 from Shipley Corporation, Marlboro, Mass. 01752. The material is based on an acrylic composition with cross-linking components that consist of hydroxyl groups and amino cross-linkers. A detailed chemical composition is not available due to its proprietary nature. The transmittance at 400 nm is 99.7% and 100% in 550 nm after curing for 45 minutes at 250° C. The material has been used as a transparent overcoat for flat panel display applications as revealed by the materials supplier.

Another example of a thermally stable, transparent microlens material is colorless polyimide. An example of such colorless polyimide is a hexafluordihydride diphenyldisulphone formed polyimide with chemical structure as follows:

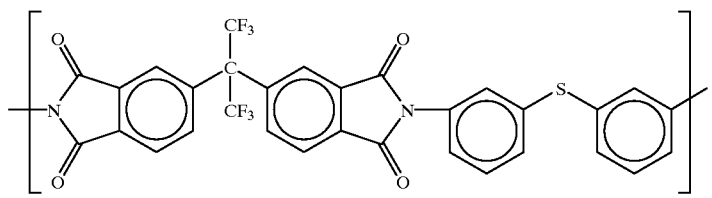

The colorless polyimide material is commercially available under the trade name of LaRC from SRS Technologies, System Technology Group, 500 Discovery Drive, Huntsville, Ala. 35806-2810. The polyimide can be spun through spin coating of a stoichiometrical mixture of 2,2-bis-(3,4-dicarboxyphenyl) hexafluoropropane dianhydride (HFDA) and 3,3'-diaminodiphenylsulphone ($DDSO_2$) in solvent dimethylacetamide and cured in a forced air oven at 150° C. and 250° C. each for one hour. The material has a transmittance larger than 95% in a wavelength range of 400–700 nm. The glass transition temperature of this material is approximately 279° C. which is much higher than typical package soldering temperatures which are around 210 to 230° C. The glass transition temperature is generally the temperature where the materials change from a stable glassy state to a more deformable softening state. More information about this material can be found from the published paper titled "*Evaluation of Colorless Polyimide Film for Thermal Control Coating Applications,*" by Anne K. St. Clair, and Wayne S. Slemp, NASA Technical Memorandum 86341, National Aeronautics and Space Administration, Langley Research Center, Hampton, Va. 23665.

A further example of a thermally stable transparent material suitable as a microlens material is perfluorocyclobutane containing aromatic ether polymer with a chemical structure as follows:

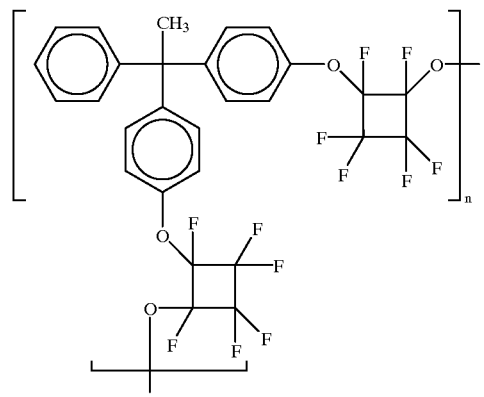

The material is available under trade name of XU-35033.00 from Dow Chemical, Midland, Mich. 48674. A thin film microlens material is formed by first coating a prepolymer solution containing 1,1,1-tris(4, trifuorivinyloxyphenylethane) in solvent mesitylene available under the trade name of XU-35031.00, then heating the spun film at 180° C. for 1 hour. The prepolymer will undergo a thermal cyclization reaction to form thermal stable cured film. A final glass transition of 400° C. can be obtained.

The material of microlens material 300 is non-photoimageable. As noted above, photo-imageable materials, such as photoresist, tend to discolor (e.g., yellow), particularly where the cross-linking effected by a light source (e.g., photobleaching) is incomplete. It is to be appreciated, however, that photo-imageable material is suitable for microlens material 300 provided the cross-linking is complete and the material is stable at fabrication temperatures.

Microlens material 300 is deposited to a thickness generally governed by the desired final lens size and shape. A suitable thickness for current technology is approximately 1.0 µm–3.0 µm. One factor in determining the desired thickness of microlens material 300 is a desired microlens curvature or sag of, for example, a convex microlens. The formation of a curved microlens will be described in detail below. However, for current purposes, a suitable curvature or sag, measured from the apex of curved microlens material 300 to the CFA material, would be, for example, approximately 1.0–1.5 µm.

Figure 5:
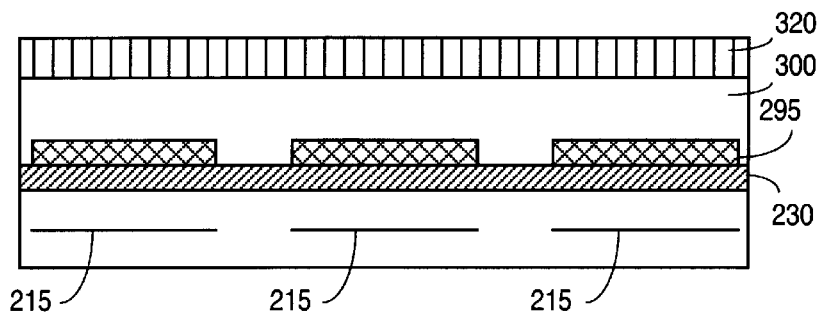
FIG. 5 shows the sensor of FIG. 4 after further processing by depositing a photoresist masking layer over the planarized microlens material in accordance with an embodiment of the invention.
Figure 6:
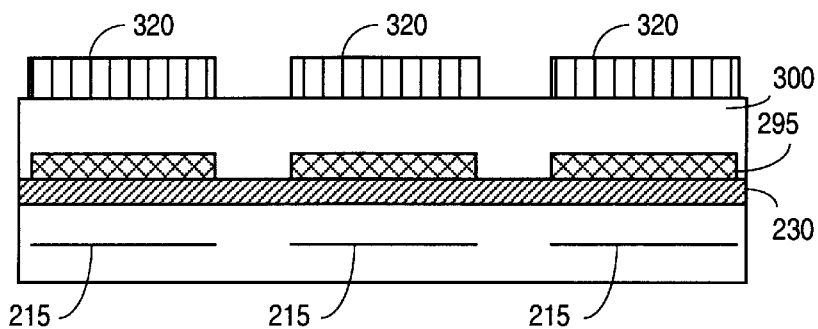
FIG. 6 shows the substrate of FIG. 4 after further processing by initially patterning the photoresist masking layer in accordance with an embodiment of the invention.

FIG. 5 shows the sensor of FIG. 4 after further processing by spinning on a positive photoresist masking material 320 over the substrate. Photoresist masking material 320 is spun on, in this embodiment, to form a mask to define a microlens area. Photoresist masking material 320, in this example, is photo-imageable. Photoresist masking material 320 is exposed to a light source through a reticle to define a mask pattern for photoresist masking material 320 over each photosensitive circuit 215 and exposing microlens material 300 directly overlying bond pad 310. The light source causes exposed photoresist masking material 320 to cross-link and polymerize. Once the pattern is established, the unexposed photoresist masking material 320 is rinsed away with a developer to leave a mask pattern as shown in FIG. 6. The substrate is baked, according to conventional methods, to solidify the remaining photoresist masking material 320. It is to be appreciated that there are other suitable materials, beyond positive photoresist, that are suitable as a masking layer in an embodiment of a method of the invention.

Figure 7:
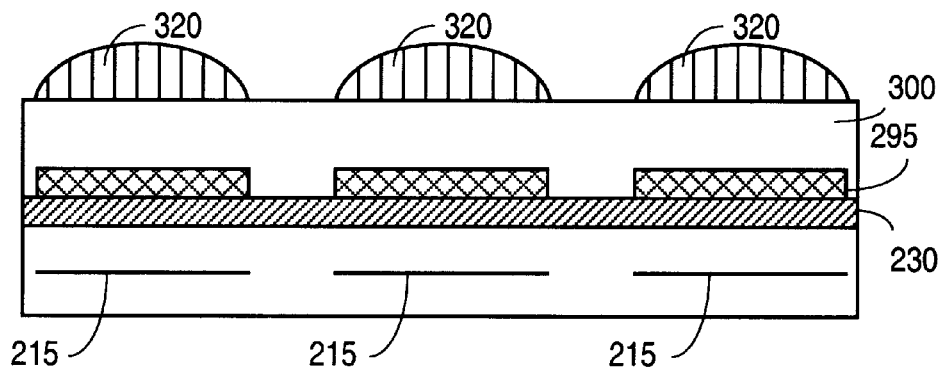
FIG. 7 shows the substrate of the sensor of FIG. 4 after further processing by shaping the photoresist masking material to form a microlens curvature in accordance with an embodiment of the invention.

Once the mask pattern of photoresist masking material 320 is defined, the sensor is heated to approximately 150° C. or other suitable temperature to cause photoresist masking material 320 to melt. The surface tension resulting from the melting process causes photoresist masking material 320 patterned individually over each photosensitive circuit 215 to adopt a curve or arcuate shape, referred to as a sag pattern. The sag pattern shown in FIG. 7 will be used as an initial microlens shape to form microlenses in microlens material 300 having a similar pattern.

Once the initial sag pattern is formed, microlens material 300 is patterned using photoresist masking material 320 as an initial pattern. A suitable patterning method includes a reactive ion etching of microlens material 300. Suitable etch chemistries and etch rates for carrying out the etching process are determined based at least in part on the nature of the material for microlens material 300 and the desired shape of the final microlens. For example, for microlens material 300 of an acrylic polymer such as polymethylmethacrylate, a suitable etchant includes an $O_2/CF_4$ etch chemistry with $O_2$ concentration greater than 90%.

Figure 8:
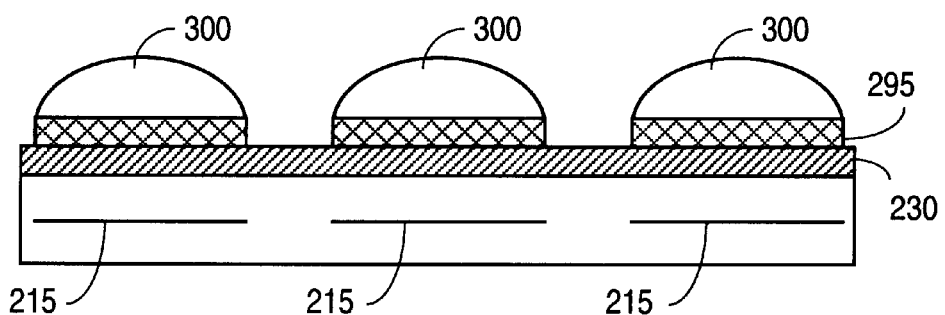
FIG. 8 shows the sensor of FIG. 4 after further processing by etching the microlens material using the photoresist mask as a pattern to form the microlens with the desired curvature and to open a bond pad in accordance with an embodiment of the invention.

FIG. 8 shows the image sensor of an embodiment of the invention after reactive ion etching to form a microlens pattern of microlens material 300. As shown in FIG. 8, microlens material 300 adopts, at least initially, the lens shape or sag shape of photoresist masking material 320. Thus, the thickness of photoresist masking material 320 and its melting properties at least in part determine a final microlens shape for planarization material 300. A second variable in this embodiment of the invention to establish a desired microlens shape is the etch chemistry and the etch rate used to define the microlenses over each photosensitive circuit. By choosing the appropriate etch chemistry and etch rate, the microlens shape may be patterned as desired.

The above description of an embodiment the invention describes a process of utilizing a microlens or planarization material other than specialized photoresist to form a microlens array for the image sensor. In this manner, materials may be chosen for the microlens material that have chemical and physical properties that are resistant to degradation in the presence of increased temperature or environmental effects. In this manner, microlenses may be formed that do not suffer the problems associated with prior art specialized photoresist microlenses including yellowing and other degradation. Further, since a material may be chosen for the microlens material that is highly transparent, photobleaching the microlens material can be eliminated.

This embodiment of a process of the invention also improves the control of the microlens curvature. This embodiment of the invention describes the formation of the microlenses, at least in part, by etching. By controlling the etch activity of the microlens or planarization material in addition to the initial microlens photoresist pattern, the curvature of the final microlens shape can be increased or decreased from the initial microlens shape created by melting the photoresist.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of forming a microlens comprising:
   depositing a substantially non-photo-imageable microlens material over an area of an integrated circuit chip a portion of which contains an array of photosensitive circuits; and
   patterning the microlens material over the array of photosensitive circuits to define a microlens over each photosensitive circuit.

2. The method of claim 1, wherein prior to depositing a microlens material, the method further comprises:
   patterning a color filter material over each photosensitive circuit.

3. The method of claim 1, wherein prior to patterning a microlens material, the method further comprises:
   patterning a masking material over the microlens material substantially corresponding to the underlying array of photosensitive circuits.

4. The method of claim 3, wherein patterning the masking material further comprises patterning the top surface of the masking material to have a substantially convex shape.

5. A method of forming a microlens comprising:
   patterning a color filter material over each of an array of photosensitive circuits of an integrated circuit chip;
   depositing a substantially non-photo-imageable microlens material over the color filter material; and
   patterning the microlens material over the color filter material to define a microlens over each photosensitive circuit.

6. The method of claim 5, wherein prior to patterning a microlens material, the method further comprises:

patterning a masking material over the microlens material substantially corresponding to the underlying array of photosensitive circuits.

7. The method of claim 6, wherein patterning the masking material further comprises patterning the top surface of the masking material to have a substantially convex shape.

8. The method of claim 6, wherein depositing a microlens material further comprises depositing the microlens material over an area of a chip a portion of which contains at least one bond pad, and wherein patterning the masking material further comprises patterning the masking material to expose the microlens material overlying the at least one bond pad.

9. An apparatus comprising:

an array of photosensitive circuits on a substrate;

an array of color filter material over the array of photosensitive circuits, one of the array of color filter material being over one of the array of photosensitive circuits; and a substantially non-photo-imageable microlens material over each one of the array of color filter material.

10. The apparatus of claim 9, wherein one surface of the microlens material has a generally convex shape.

11. The apparatus of claim 9, wherein the microlens material comprises one of a cross-linked acrylic polymer and a cross-linked polysiloxane.

12. The apparatus of claim 9, wherein the microlens material comprises perfluorocyclobutane ether polymer.

13. The apparatus of claim 9, wherein the microlens material comprises a substantially colorless polyimide.

14. An imaging system comprising:

an imaging sensor of an integrated circuit having an array of photosensitive circuits on a substrate capable of providing sensor signals in response to incident light and control signals, an array of color filter material over the array of photosensitive circuits, one of the array of color filter material over one of the array of photosensitive circuits, and a substantially non-photo-imageable microlens material over each one of the array of color filter material;

control circuitry configured to generate control signals for controlling the imaging sensor; and signal processing circuitry to generate image data in response to imaging sensor signals.

15. The photosensitive array of claim 14, wherein one surface of the microlens material has a generally convex shape.

16. The photosensitive array of claim 14, wherein the microlens material comprises one of an acrylic polymer and a polysiloxane.

17. The photosensitive array of claim 14, wherein the microlens material comprises fluorocyclobutane ether polymer.

18. The photosensitive array of claim 14, wherein the microlens material comprises a substantially colorless polyimide.

* * * * *